United States Patent
Kim

(10) Patent No.: US 11,164,620 B1
(45) Date of Patent: Nov. 2, 2021

(54) TIMING SIGNAL CALIBRATION FOR ACCESS OPERATION OF A MEMORY DEVICE

(71) Applicant: Micron Technology, Inc., Boise, ID (US)

(72) Inventor: Jaeil Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/891,601

(22) Filed: Jun. 3, 2020

(51) Int. Cl.
| | |
|---|---|
| *G11C 7/22* | (2006.01) |
| *G11C 11/4076* | (2006.01) |
| *G11C 11/408* | (2006.01) |
| *G11C 29/02* | (2006.01) |
| *G11C 29/50* | (2006.01) |
| *G11C 11/4093* | (2006.01) |

(52) U.S. Cl.
CPC .......... *G11C 11/4076* (2013.01); *G11C 7/222* (2013.01); *G11C 11/4087* (2013.01); *G11C 29/023* (2013.01); *G11C 29/50012* (2013.01); *G11C 11/4093* (2013.01); *G11C 2207/2254* (2013.01)

(58) Field of Classification Search
CPC ............ G11C 11/4076; G11C 11/4087; G11C 29/023; G11C 29/50012; G11C 7/222; G11C 11/4093; G11C 2207/2254
See application file for complete search history.

(56) References Cited

U.S. PATENT DOCUMENTS

| | | | | | |
|---|---|---|---|---|---|
| 6,304,511 | B1* | 10/2001 | Gans | .................. | G11C 7/22 365/233.14 |
| 6,316,980 | B1* | 11/2001 | Vogt | .................. | G11C 7/1051 327/241 |
| 2005/0184739 | A1* | 8/2005 | Lin | .................. | G01R 31/31727 324/601 |
| 2010/0085824 | A1* | 4/2010 | Nagata | .................. | G11C 7/222 365/194 |
| 2013/0176800 | A1* | 7/2013 | Ware | .................. | G11C 11/4076 365/194 |
| 2021/0044417 | A1* | 2/2021 | Stott | .................. | G11C 7/22 |

\* cited by examiner

*Primary Examiner* — Mushfique Siddique
(74) *Attorney, Agent, or Firm* — Holland & Hart LLP

(57) ABSTRACT

Methods, systems, and devices for timing signal calibration for a memory device are described. In some memory devices, operations for accessing memory cells may be performed with timing that is asynchronous with an input signal. To support asynchronous timing, a timing signal generation component of a memory device may include delay components that support generating a timing signal having aspects that are delayed relative to an input signal. Delay components may have characteristics that are sensitive to fabrication or operational variability, such that timing signals may also be affected by such variability. In accordance with examples as disclosed herein, a memory device may include delay components, associated with access operation timing signal generation, that are configured to be selectively enabled or disabled based on a calibration operation of the memory device, which may improve an ability of the memory device to account for various sources of timing signal variability.

26 Claims, 8 Drawing Sheets

TIMING SIGNAL CALIBRATION FOR ACCESS OPERATION OF A MEMORY DEVICE

BACKGROUND

The following relates generally to one or more memory systems and more specifically to timing signal calibration for a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
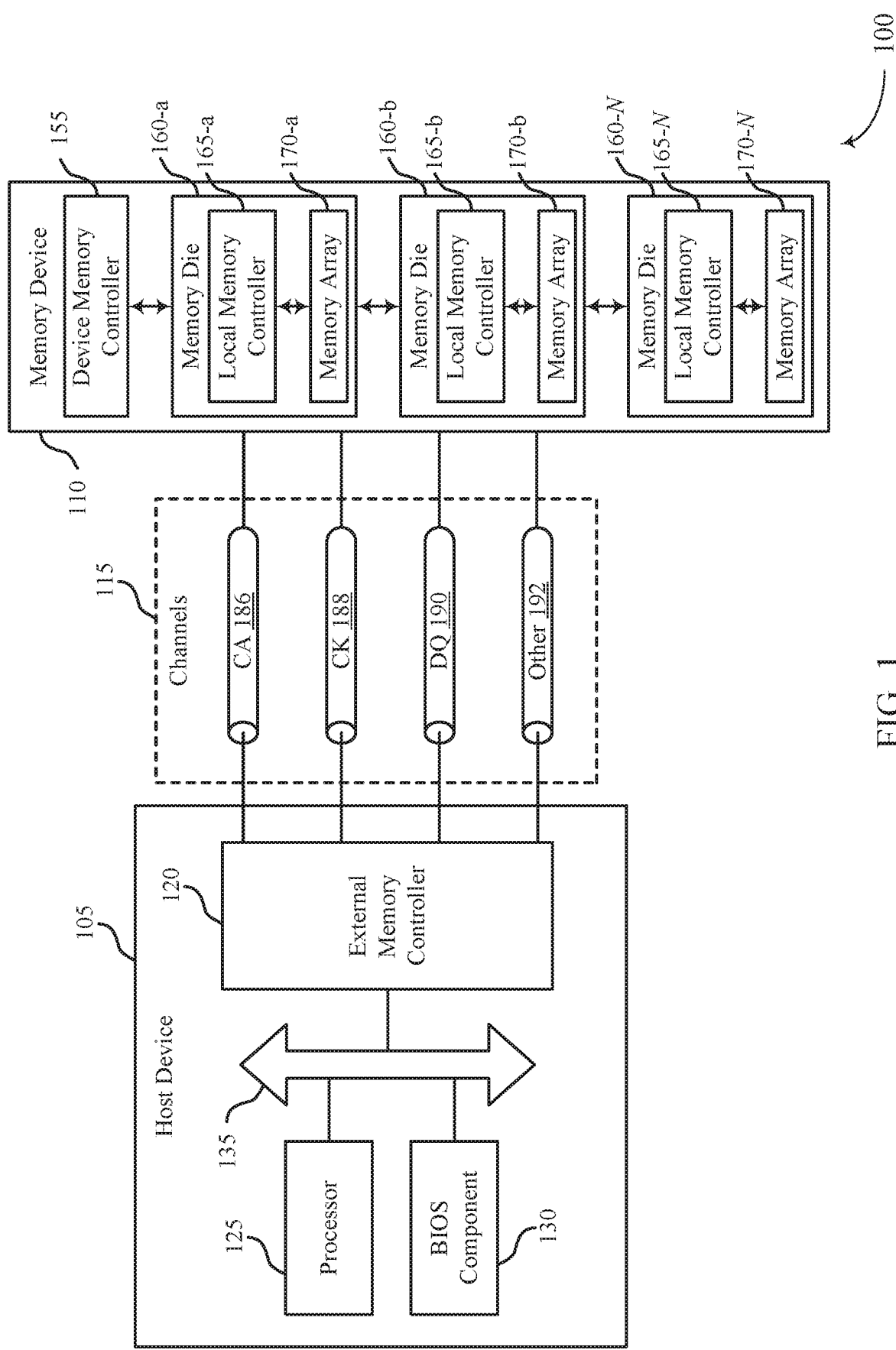
FIG. 1 illustrates an example of a system that supports timing signal calibration for a memory device in accordance with examples as disclosed herein.

In some memory devices, accessing memory cells may involve multiple operations controlled by multiple signals. The multiple operations may be performed with timing that is generated from an input signal. Thus, at least some internal operations may occur at a different time than a rising edge transition or a falling edge transition of an input signal such as a clock signal or command signal. Such operations may be triggered or otherwise supported by core timing signals of the memory device, which may be generated by a timing signal generation component of the memory device. To support timing of multiple signals, a timing signal generation component of a memory device may include delay components that support generating a timing signal having aspects that are delayed or timed relative to an input signal, which may be received from or otherwise related to signaling from a host device. Such timing signals generated by delay elements may be referred to as asynchronous timing signals. In one example, a delay component may support generating a read strobe signal, which may trigger or initiate latching information detected by a sense amplifier, or transferring information to an input/output component of a memory device, among other purposes. A read strobe signal may have a transition (e.g., rising edge, falling edge) that is delayed relative to a transition of an input signal (e.g., a column selection signal, a column activation signal), or may have a pulse width (e.g., a duration between a rising edge and a falling edge) that is based at least in part on delay elements.

A delay component may include various circuit elements that impose a delay between a transition of an input signal and a corresponding transition of an output signal. For example, a delay component may include one or more gate delays or gate delay components, which may be associated with a duration between an input signal of the component crossing a threshold voltage and an output signal of the component crossing the threshold voltage. Gate delay components may be chained together in series, where such a configuration of components may be referred to as a delay chain. In some examples (e.g., to support a delay between a rising edge of an input signal and a rising edge of an output signal), a delay chain may include an even number of inverters connected in series. However, other configurations may be used to support timing signal generation. In some examples, delay components may have timing characteristics that are sensitive to fabrication variability (e.g., process variability) or operating condition variability (e.g., voltage variability, temperature variability), such that asynchronous timing signals may also be affected by such variability. The variability of asynchronous timing signals may be associated with adverse performance of a memory device, including reduced read margins, increased read or write errors, longer latency to support timing or signaling uncertainties, and others.

In accordance with examples as disclosed herein, a memory device may include delay components, associated with access operation timing signal generation, that are configured to be selectively enabled or disabled (e.g., bypassed) based on a calibration operation of the memory device. In some examples, the calibration operation may include sequentially processing a first timing signal (e.g., a calibration timing signal) through each of a first set of delay components to generate a set of delayed timing signals. The different delays associated with respective ones of the set of delayed timing signals may support an identification of which delay components, or how many delay components, of a second set of delay components should be enabled to support access operation timing signals of the memory device. The selective enabling or disabling of such delay components may improve the ability of a memory device to account for fabrication variability, operating condition variability, or other phenomena, including aspects related to asynchronous timing signal generation.

Features of the disclosure are initially described in the context of memory systems and dies as described with reference to FIGS. 1 and 2. Features of the disclosure are described in the context of timing signal calibration circuitry and operations, and timing signal generation leveraging such calibration circuitry and operations, as described with reference to FIGS. 3 through 5. These and other features of the disclosure are further illustrated by and described with reference to an apparatus diagram and flowcharts that relate to timing signal calibration for a memory device as described with reference to FIGS. 6 and 7.

FIG. 1 illustrates an example of a system 100 that supports timing signal calibration for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, operations for accessing memory arrays 170 may be triggered or otherwise supported by core timing signals of the memory device 110, which may be generated by a timing signal generation component of the memory device 110 (e.g., of a device memory controller 155, of a local memory controller 165). To support asynchronous timing, a timing signal generation component of the memory device 110 may include delay components that support generating a timing signal having aspects that are delayed or timed relative to an input signal, which may be received from or otherwise related to signaling from the host device 105 (e.g., a command signal received on a CA channel 186). In one example, a timing signal generation component may generate a read strobe signal, which may trigger or initiate latching information detected by a sense amplifier or read latch, or transferring information to an input/output component of a memory device (e.g., latching information for output on a DQ channel 190 or related signal path of the memory device 110).

In some examples, delay components may have characteristics that are sensitive to fabrication variability (e.g., process variability) or operating condition variability (e.g., voltage variability, temperature variability), such that core timing signals may also be affected by such variability. Variability of core timing signals may be associated with adverse performance of the memory device 110, or the system 100 as a whole, including reduced read margins, increased read or write errors, longer latency to support timing or signaling uncertainties, and others. In accordance with examples as disclosed herein, the memory device 110 may include delay components, associated with access operation timing signal generation, that are configured to be selectively enabled or disabled (e.g., bypassed) based on a calibration operation of the memory device 110. The selective enabling or disabling of such delay components may improve the ability of the memory device 110 to account for fabrication variability, operating condition variability, or other phenomena.

Figure 2:
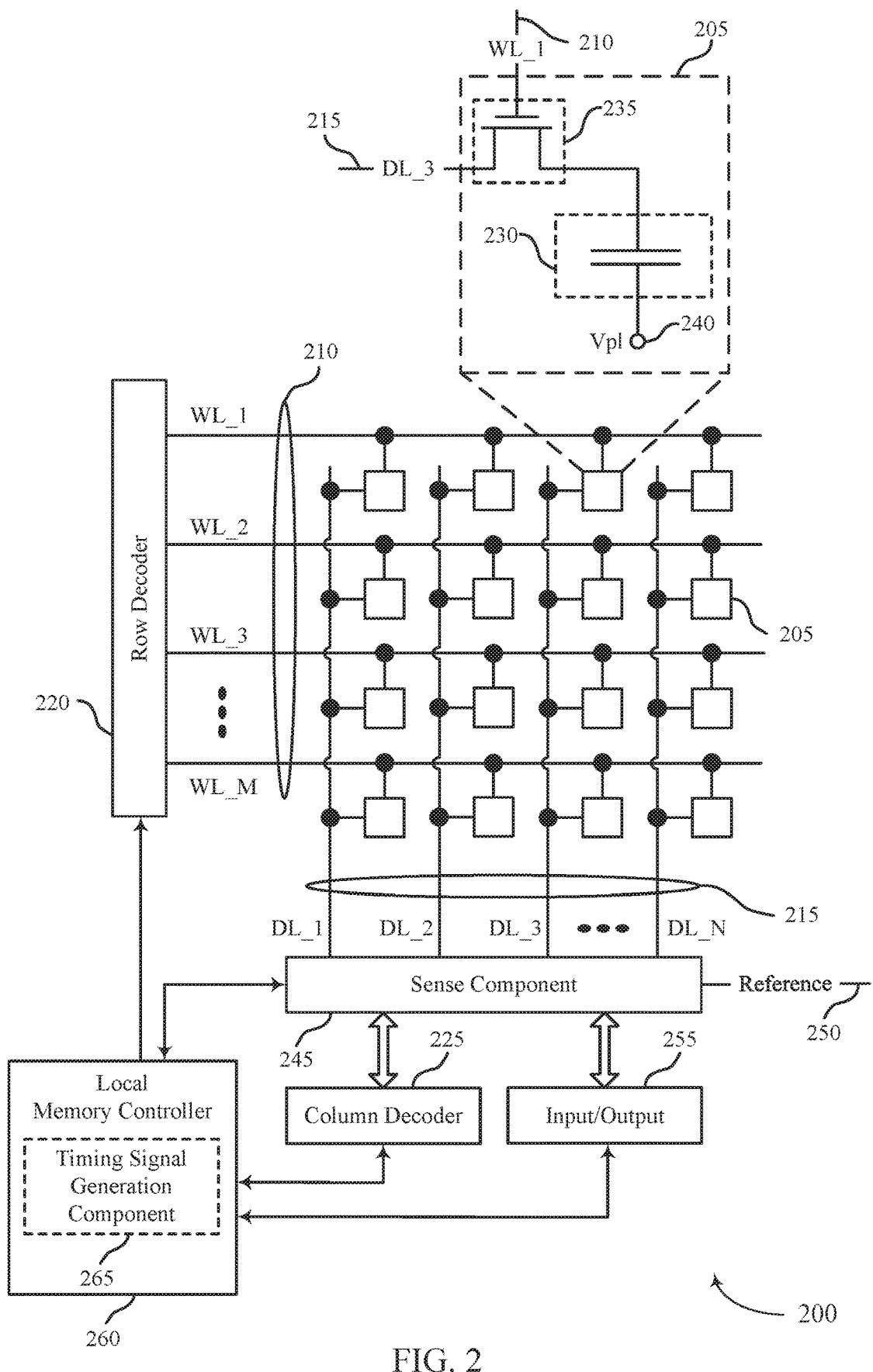
FIG. 2 illustrates an example of a memory die that supports timing signal calibration for a memory device in accordance with examples as disclosed herein.

FIG. 2 illustrates an example of a memory die 200 that supports timing signal calibration for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Access operations of the memory die 200 may be triggered or otherwise supported by core timing signals of the memory die 200, or a memory device 110 that includes the memory die 200, which may be generated by a timing signal generation component of the memory die 200 or associated memory device 100. In one example, a local memory controller 260 may include a timing signal generation component 265, but a timing signal generation component 265 may be included in other portions of a memory device 110, or distributed between multiple components of a memory device. In one example, the timing signal generation component 265 may generate a read strobe signal, which may be an example of an asynchronous timing signal to support (e.g., trigger, initiate) latching information detected by the sense component 245 (e.g., output by a sense amplifier of the sense component 245), transferring information to the input/output component 255, or latching information of the input/output component 255 to a channel shared with a host device 100 (e.g., a DQ channel), among other purposes. The timing signal generation component 265 may generate a read strobe signal having a transition (e.g., rising edge, falling edge) that is delayed relative to a transition of a second signal, such as a column selection signal associated with the column decoder 225 selecting or activating a digit line 215. In some examples, the timing signal generation component 265 may generate a read pulse signal having a pulse width (e.g., a duration between a rising edge and a falling edge) that is based at least in part on delay elements of the timing signal generation component 265.

The timing signal generation component 265 may have operating characteristics that are sensitive to fabrication variability (e.g., process variability) or operating condition variability (e.g., voltage variability, temperature variability), such that timing signals of the memory die 200 may also be affected by such variability. Variability of timing signals may be associated with adverse performance of the memory die 200, or a memory device 110 or system that includes the memory die 200, including reduced read margins, increased read or write errors, longer latency to support timing or signaling uncertainties, and others. In accordance with examples as disclosed herein, the timing signal generation component 265 may include delay components, associated with access operation timing signal generation, that are configured to be selectively enabled or disabled (e.g., bypassed) based on a calibration operation. The selective enabling or disabling of such delay components may improve the ability of access operations performed on the memory die to be less dependent on fabrication variability, operating condition variability, or other phenomena.

Figure 3:
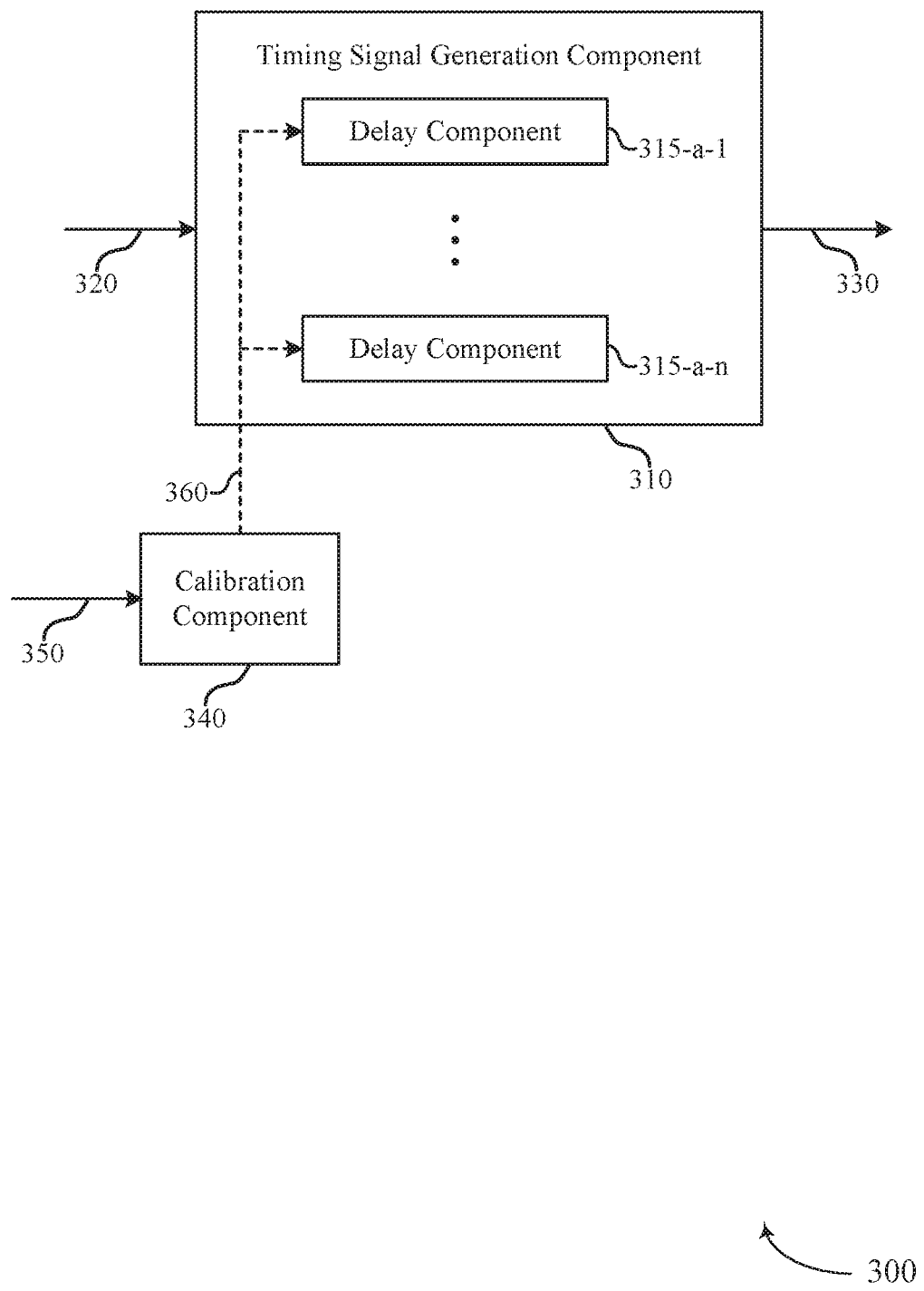
FIG. 3 illustrates a block diagram of a timing circuit that supports timing signal calibration for a memory device in accordance with examples as disclosed herein.

FIG. 3 illustrates an example of a timing circuit 300 that supports timing signal calibration for a memory device in accordance with examples as disclosed herein. The timing circuit 300 may refer to circuitry of a memory device 110, and may be a component of a device memory controller 155, a local memory controller 165, or a local memory controller 260, or other portions of a memory device 110 or memory die 200. The timing circuit 300 includes a timing signal generation component 310 (e.g., an access timing component) configured to generate an access operation timing signal 330 based at least in part on one or more input signals 320. The timing signal generation component 310 may be an example of the timing signal generation component 265 described with reference to FIG. 2.

The access operation timing signal 330 may be used to trigger or initiate various access operations (e.g., asynchronous operations) of a memory device 110 or memory die 200 that includes the timing circuit 300. In one example, an access operation timing signal 330 may be a read strobe signal, which may be used to support (e.g., initiate, trigger) latching read data for output by a sense component 245 or input/output component 255 or other read latch. However, in other examples of the described techniques, an access operation timing signal 330 may refer to other types of timing or logical signals, including asynchronous timing or logical signals (e.g., asynchronous relative to a clock signal, asynchronous relative to a command signal), such as a read trigger signal, a signal used to support such operations as a row decoder 220 opening a row of memory cells 205, a column decoder 225 activating one or more columns of memory cells 205, a sense component 245 generating or latching sense signals, or a input/output component 255 latching or receiving an information exchange, among other operations.

The access operation timing signal 330 may be generated with various delays or durations relative to the one or more input signals 320, where an input signal 320 may include such signals as a clock signal, a command signal, or some other synchronization or sequencing signal at a memory device 110. In some examples, an input signal 320 may be received directly or indirectly from a host device 105 (e.g., over a CK channel, over a CA channel, via a device memory controller 155). In some examples, an input signal 320 may be generated at or forwarded by a component of a memory device 110, which may or may not be based on another signal received from a host device 105.

The delays or durations of an access operation timing signal 330 relative to an input signal 320 may be supported by one or more delay components 315 of the timing signal generation component 310. In some examples, a duration of a delay (e.g., an asynchronous delay) between an input signal 320 and an access operation timing signal 330 (e.g., between a rising edge or falling edge of the input signal 320 and a rising edge or falling edge of the access operation timing signal 330) may be based at least in part one or more of the delay components 315. In some examples, a pulse width of an access operation timing signal 330 (e.g., a duration between a rising edge and a falling edge of an access operation timing signal 330, a duration between a falling edge and a rising edge of an access operation timing signal 330) may be based at least in part on one or more of the delay components 315. The delay components 315 may include such components or circuitry as transistors, inverters, capacitors, resistors, gate delay components, or other components that are associated with a timing or duration between transitions or levels of an input signal and an output signal. In some cases, the delay components 315 may be configured in a delay chain (e.g., in series with each other). In some cases, each of the delay components 315 may have the same or a similar delay (e.g., a same number of delay gates). Alternatively, the delay components 315 may be in parallel with each other (e.g., may have different delays), and the access operation timing signal 330 may be selected from an output of one of the delay components 315.

Operating characteristics of the delay components 315, or other components of a memory device 110 (e.g., other components of the timing signal generation component 310, other components of a memory die 200 configured to support access operations), may be affected by variability, such as variations due to fabrication (e.g., processing variability, manufacturing variability) or operating conditions (e.g., voltage variability, temperature variability, frequency variability), such that access operation timing signals 330 may also be affected by such variability. For example, as a result of process or operating condition variability, access operation timing signals 330 may have longer or shorter delays relative to an input signal 320, or may have a longer or shorter pulse width, among other variability.

To reduce the sensitivity of the timing signal generation component 310, or other components or operations of a memory device 110, to processing or operational variability, the timing circuit 300 may include a calibration component 340 configured to selectively enable or disable one or more of the delay components 315 of the timing signal generation component 310. For example, the calibration component 340 may provide a calibration signal 360 (e.g., a delay configuration signal) to the delay components 315, or other supporting circuitry of the timing signal generation component 310 (e.g., signal path selection components or circuitry), to cause a respective delay component 315 to be enabled (e.g., included in an access operation timing signal delay chain) or disabled (e.g., bypassed from an access operation timing signal delay chain). In various examples, the calibration component 340 may be co-located with the timing signal generation component 310 (e.g., in a memory die 200), or the calibration component 340 may be located in a different portion of a memory device 110 (e.g., in a device memory controller 155).

In some examples, the calibration component 340 may be configured to process a calibration input signal 350 (e.g., an input signal, a timing signal) sequentially through a set of delay components (e.g., of the calibration component 340, which may be different than the delay components 315) to generate a set of delayed timing signals. Each of the delayed timing signals may have a different delay duration, and respective timing signals may be compared directly or indirectly (e.g., using an intermediary signal based at least in part on the delayed timing signal) against another signal to evaluate a target delay duration, or whether an existing delay duration should be lengthened (e.g., by enabling one or more delay components 315 that was disabled) or shortened (e.g., by disabling one or more delay components 315 that was enabled. In other words, the different delays associated with respective ones of the set of delayed timing signals of the calibration component 340 may support an identification or inference of which delay components 315, or how many delay components 315, of the timing signal generation component 310 should be enabled to support the timing signal generation component 310 generating an access operation timing signal 330.

The selective enabling or disabling of delay components 315 may improve the ability of a memory device to account for fabrication variability, operating condition variability, or other phenomena. For example, when the access operation timing signal 330 refers to a read strobe signal, a pulse width or timing of the read strobe signal may be sensitive to fabrication or operational variability of a memory device 110. If a pulse width of a read strobe signal is too short, or a read strobe signal otherwise transitions at a duration too soon after a column selection or activation signal, read signals based on accessing a memory cell 205 may not be fully developed, which may be referred to as or otherwise associated with a setup margin failure. If a pulse width of a read strobe signal is too long, or a read strobe signal otherwise transitions without satisfying a hold margin relative to a first column selection or activation signal, a second column selection or activation signal may be issued prior to latching signaling or information based on accessing a first memory cell 205 associated with the first column selection or activation signal. In some such cases, a logic value associated with accessing the first memory cell 205 may be lost, or a different memory cell 205 may have been accessed (e.g., as associated with the second column selection or activation signal), which may be referred to as or otherwise associated with a hold margin failure. Thus, to support properly accessing a memory cell 205 for a read operation, aspects of a read strobe signal may be adjusted to account for fabrication or operational variations, among other reasons.

In some examples of generating read strobe signals, the calibration component 340 may be configured to calibrate the timing signal generation component 310 (e.g., by way of selectively enabling or disabling delay components 315) to generate a read strobe signal with a pulse with that is equal to, or otherwise based at least in part on a pulse width, or cycle time (e.g., periodicity), of a clock signal or other reference signal. The clock signal used for such a calibration may be sampled or otherwise received at an instance that is unrelated to a particular access command, such that an access operation signal 33 is not itself generated based on the clock signal. Rather, the calibration component 340 may determine a calibration result from a received clock signal, with such a result stored or otherwise applied in multiple subsequent access operations to generate subsequent access operation timing signals 330.

In some examples, the timing signal generation component 310 may be calibrated to generate a timing for an access operation timing signal 330, relative to a column selection or activation signal, based on a selective enabling or disabling of delay components 315. In some examples, a clock signal or other reference signal may be provided to the calibration component 340 as a calibration input signal 350, such that the calibration component 340 generates the calibration signal 360 based on which delay components 315 or a quantity of delay components 315 that should be enabled or disabled to generate a read strobe signal (e.g., an access operation timing signal 330) with the desired pulse width or duration. Such timing calibration may be based at least in part on performing a calibration operation that uses delay components of the calibration component 340 that are the same (e.g., having the same number or type of delay components), or different than the delay components 315.

Thus, according to these and other examples, the timing signal generation component 310 may be configured for generating an access operation timing signal 330 having timing characteristics that are based at least in part on a selective enabling or disabling of delay components 315, with such selective enabling or disabling being based at least in part on a calibration signal 360. In some examples, the timing signal generation component 310 may support generating a pulse width for the access operation timing signal 330 based at least in part on the selective enabling or disabling of the second plurality of delay components 315. Additionally or alternatively, the timing signal generation component 310 may support generating a timing or delay of the access operation timing signal 330 (e.g., a timing of a rising edge or falling edge, relative to the input signal 320, such as a column selection signal) based at least in part on the selective enabling or disabling of the second plurality of delay components 315.

Calibration operations using the calibration component 340 may be triggered or initiated based on various operations of a memory device 110 or memory die 200. In some examples, performing calibration operations may be initiated based at least in part on identifying an initial configuration operation after powering on a memory device 110, such as an initial mode register write operation performed after powering on a memory device 110. In some examples, performing calibration operations may be initiated based at least in part on identifying a change of a frequency set point of a memory device 110, which may be initiated by signaling received from a host device 105. Calibration operations of the calibration component 340 may additionally or alternatively be initiated based on other operational modes or detections, such as a detection of an assembly or installation operation, an identified change in operating conditions, an identified change in operational modes, an identified abnormality in access timing (e.g., an identification of a setup margin failure or an identification of a hold margin failure), or an identified error detection or error correction condition, among other conditions, which may support dynamically adjusting timing characteristics of an access operation timing signal 330 in response to or to otherwise account for various sources of variability.

Figure 4A:
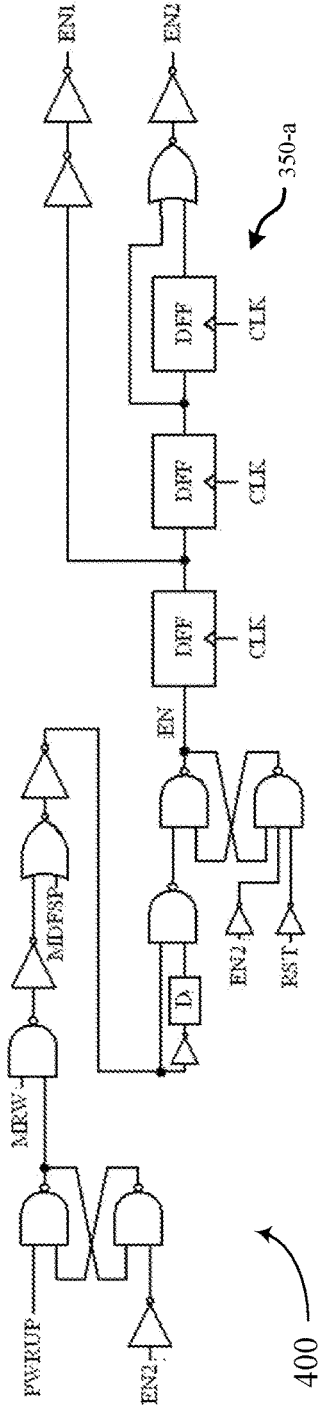
FIGS. 4A and 4B illustrate examples of a calibration input signal generator and a calibration signal generator, respectively, that support timing signal calibration for a memory device in accordance with examples as disclosed herein.
Figure 4B:
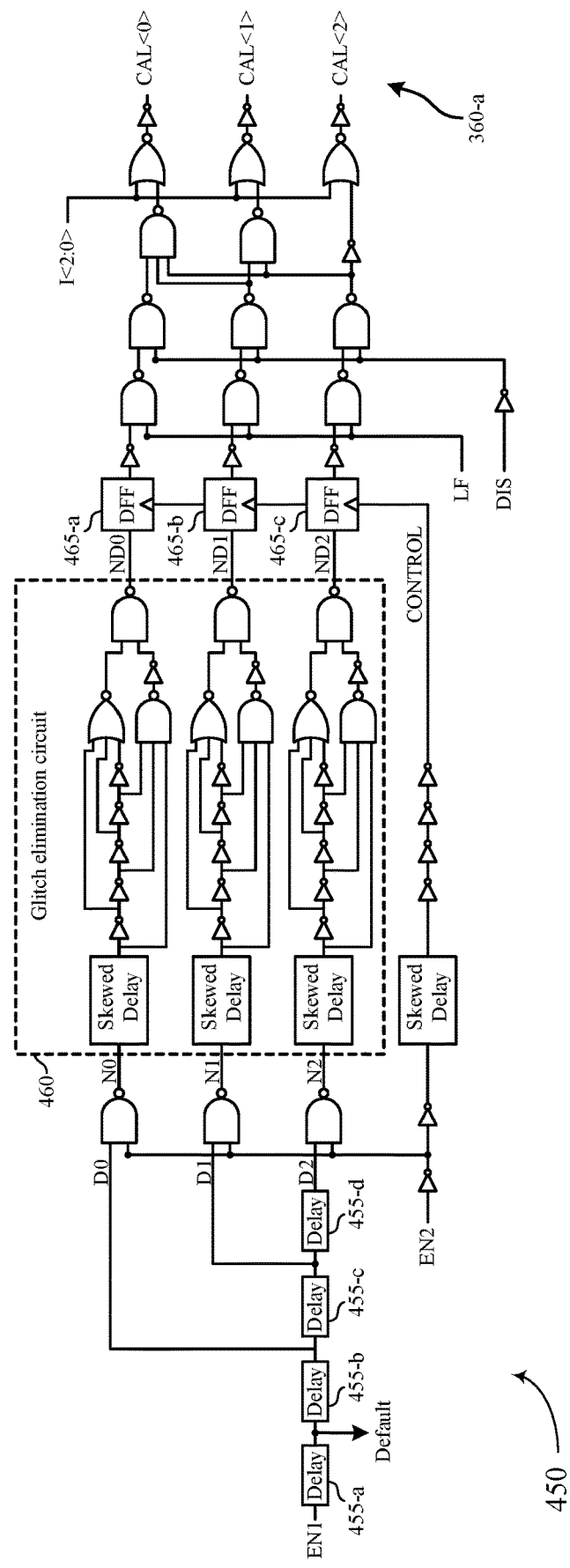

FIGS. 4A and 4B illustrate examples of a calibration input signal generator 400 and a calibration signal generator 450, respectively, that support timing signal calibration for a memory device in accordance with examples as disclosed herein. The calibration input signal generator 400 and the calibration signal generator 450 may be included in a calibration component 340 described with reference to FIG. 3. The calibration signal generator 450 may support generating signals CAL<0:2> as a single calibration signal 360-a or set of calibration signals 360-a. The calibration input signal generator 400 may support generating signals EN1 and EN2, which may be provided to the calibration signal generator 450 for generating signal or signals CAL<0:2>. Generating signals EN and EN2 may be based at least in part on signal CLK, which may be an example of a calibration input signal 350-a.

The calibration input signal generator 400 may be configured to support the calibration signal generator 450 performing a calibration operation based on an initial configuration operation after powering a memory device 110. For example, a signal PWRUP may be enabled when the memory device 110 is powered, and a signal MRW may be enabled during a mode register write operation of the memory device 110. Accordingly, during an initial mode register write operation (e.g., an initial enabling of signal MRW after enabling signal PWRUP), the calibration input signal generator 400 may proceed with generating signals EN1 and EN2 (e.g., based at least in part on toggling signal EN). The calibration input signal generator 400 may also be configured to support the calibration signal generator 450 performing a calibration operation based on a change in frequency set point of the memory device 110. For example, a signal MDFSP may be enabled when the memory device 110 has been commanded with or is otherwise performing a frequency set point change. Accordingly, during an frequency set point operation, the calibration input signal generator 400 may proceed with generating signals EN1 and EN2 (e.g., based at least in part on toggling signal EN).

Generating signal EN1 may be based at least in part on providing signal EN to a first D flip-flop (DFF), also fed by clock signal CLK. The first DFF may introduce a delay relative to signal EN, as a state transition of an output of the first DFF is triggered by a transition of clock signal CLK. The output of the first DFF may be fed through two inverters (e.g., delay inverters, gate delay components), which may introduce further delay, for generating the signal EN1 (e.g., a rising edge of signal EN1).

Generating signal EN2 may be based at least in part on providing the output of the first DFF to two further DFFs, also fed by clock signal CLK. The further DFFs may introduce further delays relative to signal EN, as a state transition of respective outputs of the further DFFs are triggered by a transition of clock signal CLK. The outputs of these DFFs may be fed through a NOR gate and inverter, as shown, for generating the signal EN2 (e.g., a rising edge of signal EN2), which may be delayed relative to signal EN1. The signal EN2 may be passed back through the calibration input signal generator 400 for generating falling edges of both signal EN1 and signal EN2.

Signals EN1 and EN2 may be provided to the calibration signal generator 450 to support the generation of signals CAL<0:2>. For example, a duration between a rising edge of EN1 and a rising edge of EN2 may be approximately equal to a duration of one clock cycle (e.g., of clock signal CLK), which may be insensitive, or relatively insensitive, to fabrication or operating condition variations of the calibration input signal generator 400. Such a duration between rising edges of EN1 and EN2 may be related to a target duration or pulse width for a read strobe signal, and the calibration signal generator 450 may accordingly enable or disable each of signals CAL<0:2> to support a timing signal generation component 310 generating a read strobe signal with such a duration or pulse width, or otherwise reducing variation to such a target that might be attributed to fabrication or operational variability.

The calibration signal generator 450 may receive the signal EN1 (e.g., a timing signal, a calibration input signal 350), and process the signal EN1 through each of four delay components 455 (e.g., calibration delay components) as shown. Although four delay components 455 are shown in the calibration signal generator 450, a calibration signal generator of calibration component 340 may include any quantity of delay components 455. In some examples, at least some of a quantity of delay components 455 may be associated with or correspond to a quantity of delay components 315 of a timing signal generation component 310 that are configured to be selectively enabled or disabled.

Each of the delay components 455 may be associated with a respective quantity of gate delays, such as a quantity of inverters (e.g., delay inverters, gate delay components) or other delaying component (e.g., an 8-gate delay). A signal through the first delay component 455-*a* (e.g., Default) may have a default delay, a signal through the second delay component 455-*b* (e.g., D0) may have the accumulated delay of two of the delay components (e.g., delay components 455-*a* and 455-*b*), a signal through the third delay component 455-*c* (e.g., D1) may have the accumulated delay of three of the delay components (e.g., delay components 455-*a*, 455-*b*, and 455-*c*), and a signal through the fourth delay (e.g., D2) may have the accumulated delay of all four of the delay components (e.g., delay components 455-*a*, 455-*b*, 455-*c*, and 455-*d*). The signals D0, D1, and D2 may be an example of delayed timing signals that each correspond to an output of a respective delay component.

The signals D0, D1, and D2 may be provided to respective NAND gates, each being also provided with an inversion of the signal EN2, for generating respective signals N0, N1, and N2. The signals N0, N1, and N2 may be processed through a glitch elimination circuit 460, which may include respective glitch elimination circuit paths through skewed delay components, inverters, and gates as shown, for generating respective signals ND0, ND1, and ND2. However, in some examples, glitch elimination circuit 460 may be omitted. The calibration signal generator 450 may also process the signal EN2 through a skewed delay component and inverters as shown, for generating a signal CONTROL. The skewed delay component and inverters for processing EN2 may introduce a delay similar to that introduced by respective processing paths of the glitch elimination circuit 460, which may help to maintain similar processing delays between signal EN2 and signals NO, N1, and N2.

Each of the signals ND0, ND1, and ND2 may be provided to a respective DFF 465, which may be triggered by the signal CONTROL. Accordingly, each of the DFFs 465 may support comparing a second timing signal (e.g., CONTROL) to each of a set of reference signals (e.g., ND0, ND1, and ND2), each reference signal of the set of reference signals based at least in part on a respective one of a set of delayed timing signals (e.g., D0, D1, D2). In another example, each of the DFFs 465 may support latching, storing, or outputting a state of each of a set of reference signals based at least in part on (e.g., triggered by) a second timing signal. Thus, the DFFs 465 may be considered as a comparison component, a latching component, or a storage component that supports evaluating signals having different timing or delays, with such an evaluation being based at least in part on a target delay or pulse width for generating an access operation timing signal 330.

The result of such a comparison or latching may be fed through further inverters and NAND gates as shown, for generating the signals CAL<0:2> (e.g., calibration signals 360-a), which may be provided to a timing signal generation component 310 for selectively enabling one or more delay components 315. For example, signal CAL<0> may support selectively including or bypassing a first delay component 315 in a delay chain of a timing signal generation component 310, signal CAL<1> may support selectively including or bypassing a second delay component 315 in the delay chain, and signal CAL<2> may support selectively including or bypassing a third delay component 315 in the delay chain. In some examples, the second delay component 455-b for processing signal EN1 may have a delay that is equal to, comparable, or otherwise representative of a delay of the first delay component 315 (e.g., corresponding to signal CAL<0>), the third delay component 455-c for processing signal EN1 may have a delay that is equal to, comparable, or otherwise representative of a delay of the second delay component 315 (e.g., corresponding to signal CAL<1>), and the fourth delay component 455-d for processing signal EN1 may have a delay that is equal to, comparable, or otherwise representative of a delay of the third delay component 315 (e.g., corresponding to signal CAL<2>). Although described with reference to three selectable delay components 315, the calibration signal generator 450 may be extended to support generating a signal CAL<0:N−1> for any number N of selectable delay components.

According to these and other examples, the delay components 455 of the calibration signal generator 450 (e.g., a component of a calibration component 340) may be surrogates for or otherwise correspond to respective delay components 315 of a timing signal generation component 310.

Operational variability of the delay components 455 may be used to infer operational variability of the delay components 315, and comparisons or evaluations of a calibration operation may be used to mitigate the effect such variability of the delay components 315 would have on the access operation timing signal 330, by way of selectively enabling or disabling delay components 315.

Figure 5A:
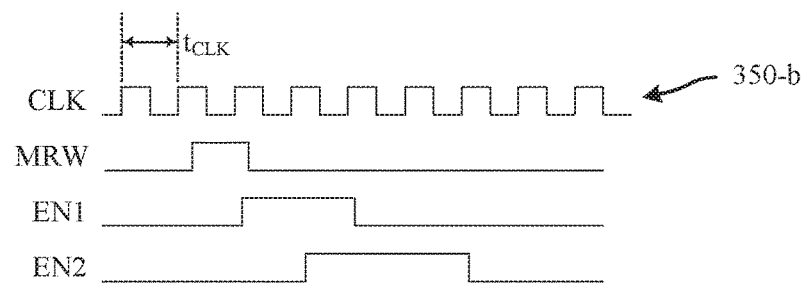
FIGS. 5A and 5B illustrate examples of timing diagrams that support timing signal calibration for a memory device in accordance with examples as disclosed herein.
Figure 5B:
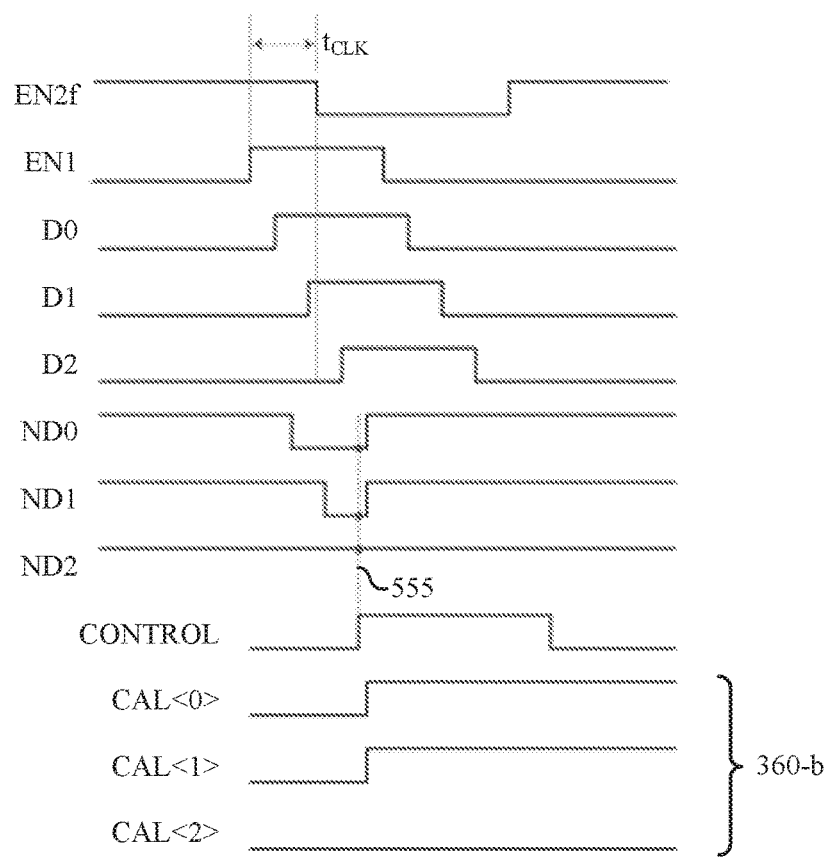

FIGS. 5A and 5B illustrate examples of timing diagrams 500 and 550, respectively, that support timing signal calibration for a memory device in accordance with examples as disclosed herein. The timing diagram 500 may illustrate an example of signaling of the calibration input signal generator 400, and the timing diagram 550 may illustrate an example of signaling of the calibration signal generator 450, described with reference to FIGS. 4A and 4B The timing diagram 500 illustrates an example for generating signals EN1 and EN2. In the example of timing diagram 500, the signal MRW may transition to a high state, which may correspond to a first mode register write after powering a memory device 110 or memory die 200 that includes the calibration input signal generator. Thus, the timing diagram 500 illustrates an example of generating calibration signals or otherwise initiating a calibration operation based at least in part on a configuration operation of the memory device 110, which may be an initial configuration operation after powering on the memory device 110. Signals EN1 and EN2 may be based at least in part on clock signal CLK (e.g., a calibration input signal 350-b), such as having a timing or pulse width that is based at least in part on clock signal CLK (e.g., a cycle time or period, $t_{CLK}$, of clock signal CLK).

The timing diagram 550 illustrates an example for generating signals CAL<0:2> (e.g., calibration signals 360-b) based at least in part on signals EN1 and EN2. In the example of timing diagram 550, a signal EN2f may illustrate a signal after a first inverter that is provided with the signal EN2, and may represent an inversion of EN2. A duration between the rising edge of EN1 and the falling edge of EN2f may be approximately equal to a clock cycle duration, $t_{CLK}$ (e.g., as described with reference to timing diagram 500), and may be used as a calibration duration for determining which of the signals CAL<0:2> should be enabled or activated.

The timing diagram 550 illustrates signals D0, D1, and D2, which may be an example of a set of delayed timing signals that each correspond to a respective delay component 455 of the calibration signal generator 450. Signals D0, D1, and D2 may have a similar pulse width as signal EN1, but each of D0, D1, and D3 may have a different respective delay in time, as shown. Signals ND0, ND1, and ND2 may refer to the processed signals output by the glitch elimination circuit 460 of calibration signal generator 450. The signals ND0, ND1, and ND2 may be compared, latched, or stored by respective DFFs 465, as triggered by the rising edge of the signal CONTROL (e.g., at time 555). The resulting output of the DFFs 465 may be further processed, and used to evaluate whether to enable respective ones of the signals CAL<0:2>. In the example of timing diagram 550, signals ND0 and ND1 are at a low signal state during the rising edge of CONTROL, and accordingly, signals CAL<0> and CAL<1> may transition to a high signal state. Signal ND2 is at a high signal state during the rising edge of CONTROL, and accordingly, signal CAL<2> may remain in a low signal state.

Timing diagram 550 illustrates an example where, at the calibration signal generator 450, a default delay (e.g., according to a single delay component) is insufficient to meet a target timing (e.g., a duration of one clock cycle). Rather, the calibration signal generator 450 determines that delays of at least two additional delay components (e.g., delay components 315) should be enabled (e.g., corresponding to the generation of signals D0 and D1). The calibration signal generator 450 also determines that a delay of a third additional delay (e.g., corresponding to the generation of signal D2) component would be excessive relative to the target. Such determinations may account for fabrication or operational variations of the calibration signal generator 450 (e.g., of the delay components for generating the signals ND0, ND1, ND2, including delay components, inverters, and gates), which may correspond to similar operational variations that may be experienced at a timing signal generation component 310. By activating signals CAL<0> and CAL<1>, and deactivating signal CAL<2>, (e.g., calibration signals 360-*b*) the calibration signal generator 450 may provide, to a timing signal generation component 310, an indication that corresponding delay components 315 should be enabled, or disabled, respectively.

In another example, not shown, the signal processing of calibration signal generator 450 may operate more quickly (e.g., due to processing or operational variation), such that signal ND2 is also at a low state during the rising edge of CONTROL. In such a case, signal CAL<2> may also be activated, activating or enabling an additional delay component 315 of a timing signal generation component 310 (e.g., to lengthen a read strobe pulse duration that would otherwise be too short due to the processing or operational variation). In yet another example, not shown, the signal processing of calibration signal generator 450 may operate more slowly (e.g., due to processing or operational variation), such that neither the signal ND1 nor the signal ND2 is at a low state during the rising edge of CONTROL. In such a case, signals CAL<1> and CAL<2> may be deactivated, such that one delay component 315 of timing signal generation component 310 is selectively enabled or activated (e.g., bypassing certain delay components 315 to shorten a read strobe pulse duration that would otherwise be too long due to the processing or operational variation).

Figure 6:
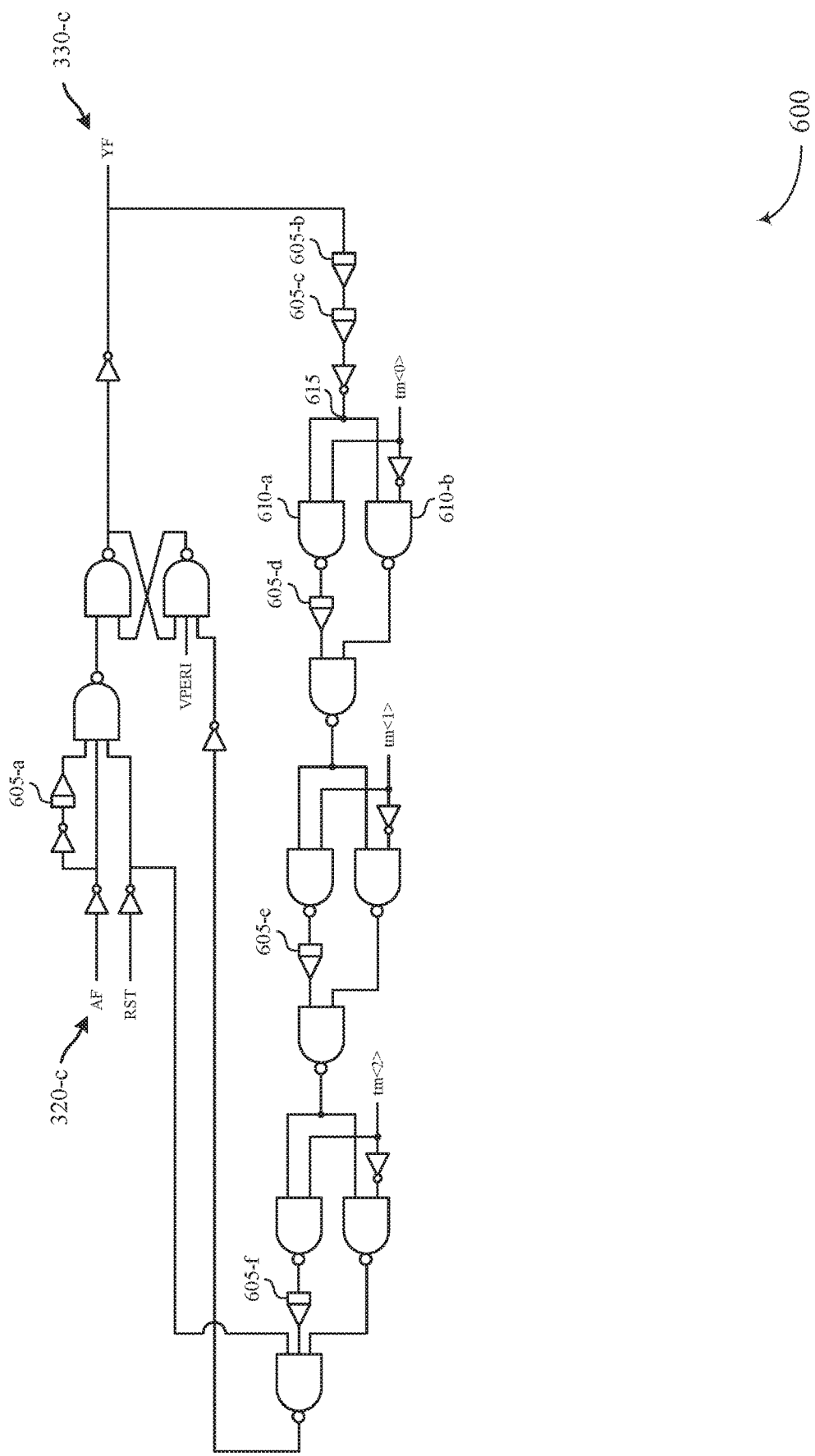
FIG. 6 illustrates an example of an access operation timing signal generator that support timing signal calibration for a memory device in accordance with examples as disclosed herein.

FIG. 6 illustrates an example of delay circuitry 600 that supports timing signal calibration for a memory device in accordance with examples as disclosed herein. In the example of delay circuitry 600, a signal AF may represent a column selection or activation signal (e.g., a signal 320-*c*), and a signal YF may represent a read strobe signal (e.g., an access operation timing signal 330-*c*) generated based at least in part on the signal AF and a set of delay components 605.

The delay components 605 may each represent a respective set of one or more gate delay components, and may accordingly each correspond to a respective delay duration. The delay component 605-*a* may generate a delay between the signal AF, as input to the delay circuitry 600, and the output signal YF, such as a delay between a rising edge of AF and a rising edge of YF. Further delay between a rising edge of AF and a rising edge of YF may be introduced by the inverters or gates, as shown. A rising edge of the signal YF may be returned through a feedback loop to generate a falling edge, for example, and a duration between the rising edge of YF and the falling edge of YF may correspond to a pulse width of signal YF.

The feedback loop may include delay components 605-*b* and 605-*c*, which may contribute to a default delay for the feedback loop. The feedback loop may also include delay components 605-*d*, 605-*e*, and 605-*f*, which may be examples of delay components 315 described with reference to FIG. 3. Each of delay components 605-*d*, 605-*e*, and 605-*f* may illustrate an example of a delay component of the delay circuitry 600 that is configured to be selectively enabled (e.g., included in the feedback loop) or disabled (e.g., bypassed in the feedback loop). For example, the selective enabling or disabling of delay components 605-*d*, 605-*e*, and 605-*f* may be supported by signals tm<0:2>, which may correspond to inverted states of signals CAL<0:2>, respectively, as described with reference to FIG. 5B.

For example, the delay component 605-*d* may be selectively enabled or disabled by way of signal tm<0>, which may be described as a disabling or bypassing signal associated with the delay component 605-*d*. When signal tm<0> is at a high state, the output of the NAND gate 610-*a* may be effectively disabled, since the high state of signal tm<0> may cause an output of the NAND gate 610-*a* to remain at a low state regardless of the state at node 615. Accordingly, any rising edge or falling edge of signaling at the node 615 may instead pass through the NAND gate 610-*b*, as fed by the inverted state of tm<0> (e.g., inverted to a low state), effectively bypassing the delay component 605-*d*. When signal tm<0> is at a low state, the output of the NAND gate 610-*b* may be effectively disabled, since the inverted low state of signal tm<0> (e.g., a high state) may cause an output of the NAND gate 610-*b* to remain at a low state regardless of the state at node 615. Accordingly, any rising edge or falling edge of signaling at the node 615 may instead pass through the NAND gate 610-*a*, as fed by the low state of tm<0>, and any rising or falling edge at the node 615 may be delayed by passing through the delay component 605-*d*. Similarly, the delay component 605-*e* may be selectively enabled or disabled by way of signal tm<1>, which may be described as a disabling or bypassing signal associated with the delay component 605-*e*, and the delay component 605-*f* may be selectively enabled or disabled by way of signal tm<2>, which may be described as a disabling or bypassing signal associated with the delay component 605-*f*.

Thus, the delay circuitry 600 may be included in a timing signal generator, such as timing signal generation component 310 described with reference to FIG. 3, where delay components 605-*d*, 605-*e*, and 605-*f* may be examples of delay components 315 that are configured to be selectively enabled or disabled. Delay components 605-*a*, 605-*b*, and 605-*c* may be examples of other delay components of a timing signal generator that are not configured to be selectively enabled or disabled (e.g., are included in the delay chain regardless of a calibration signal 360). By including delay components 605-*d*, 605-*e*, and 605-*f*, the delay circuitry 600 may support a dynamic calibration of read strobe timing, such as a dynamic calibration of a pulse width of the read strobe signal. Such a calibration may support hold margins or setup margins that track process or operational variability, which may improve operations of a memory device 110 or system 100 that includes the delay circuitry 600 compared to operations of a memory device 110 or system 100 that does not include the delay circuitry 600 or other configurable timing signal generation component 310.

Figure 7:
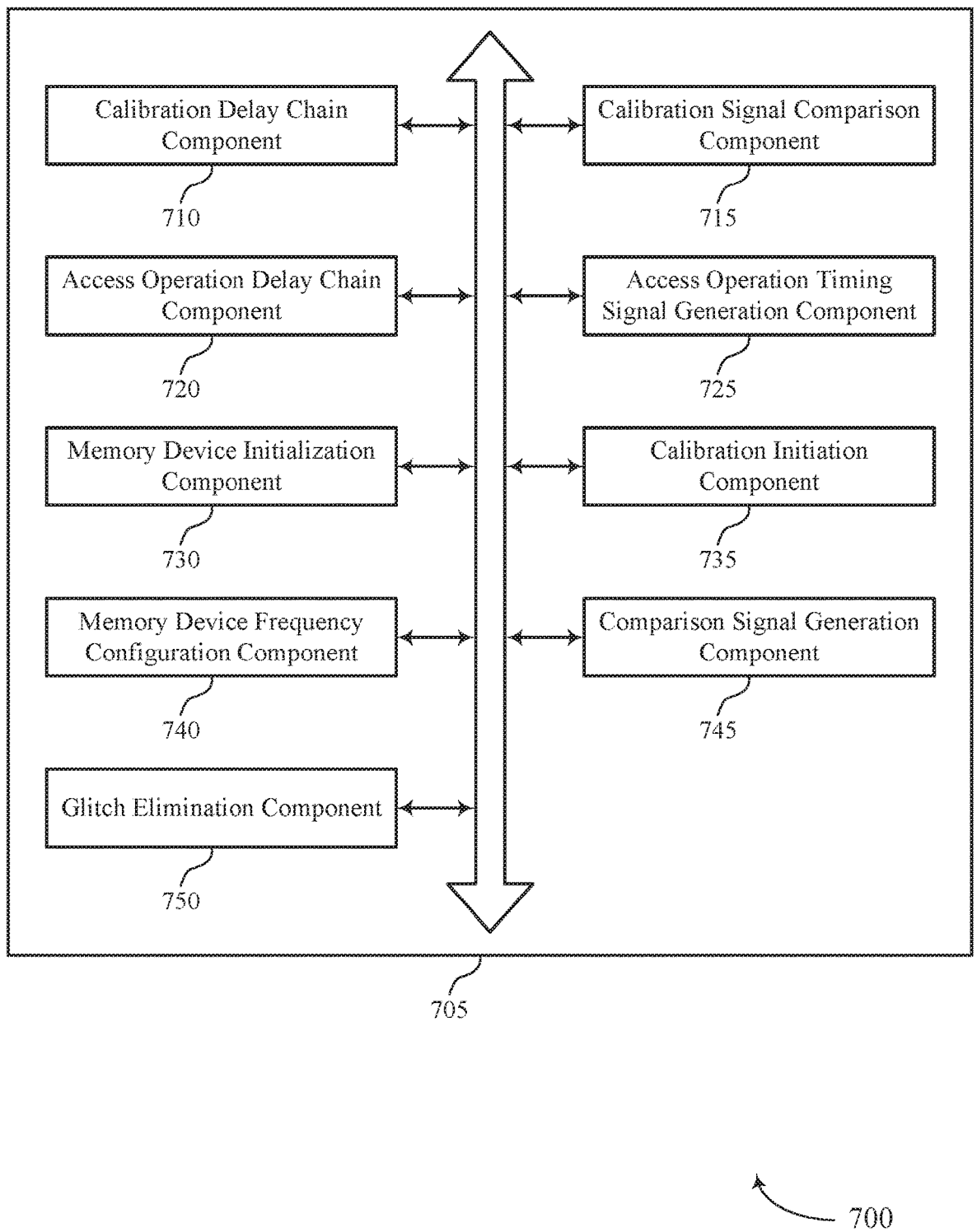
FIG. 7 shows a block diagram of a memory device that supports timing signal calibration for a memory device in accordance with aspects of the present disclosure.

FIG. 7 shows a block diagram 700 of a memory device 705 that supports timing signal calibration for a memory device in accordance with examples as disclosed herein. The memory device 705 may be an example of aspects of a memory device as described with reference to FIGS. 1 through 5. The memory device 705 may include a calibration delay chain component 710, a calibration signal comparison component 715, an access operation delay chain component 720, an access operation timing signal generation component 725, a memory device initialization component 730, a calibration initiation component 735, a memory device frequency configuration component 740, a comparison signal generation component 745, and a glitch elimination component 750. Each of these modules may communicate, directly or indirectly, with one another (e.g., via one or more buses).

The calibration delay chain component 710 may process a first timing signal sequentially through each of a first set of delay components of a memory device to generate a set of delayed timing signals that each correspond to an output of a respective delay component of the first set of delay components.

The calibration signal comparison component 715 may compare a second timing signal to each of a set of reference signals, each reference signal of the set of reference signals based on a respective one of the set of delayed timing signals.

The access operation delay chain component 720 may selectively enable or disable, based on the comparing, a second set of delay components configured for generating an access operation timing signal of the memory device. In some examples, the second set of delay components may be different than the first set of delay components.

In some examples, the access operation timing signal generation component 725 may generate the access operation timing signal for latching data for output by the memory device based on the selectively enabling or disabling of the second set of delay components.

In some examples, to generate the access operation timing signal, the access operation timing signal generation component 725 may generate a pulse width for the access operation timing signal based on the selectively enabling or disabling of the second set of delay components.

In some examples, to generate the access operation timing signal, the access operation timing signal generation component 725 may generate a timing for the access operation timing signal relative to a column selection of the memory device based on the selectively enabling or disabling of the second set of delay components.

In some examples, the memory device initialization component 730 may identify an initial configuration operation after powering the memory device.

In some examples, the calibration initiation component 735 may generate the first timing signal based on identifying the initial configuration operation.

In some examples, the memory device frequency configuration component 740 may identify a change of a frequency set point of the memory device.

In some examples, the calibration initiation component 735 may generate the first timing signal based on identifying the change of the frequency set point.

In some examples, the comparison signal generation component 745 may generate the second timing signal based on a pulse width of a clock signal received at the memory device.

In some examples, glitch elimination component 750 may generate each of the set of reference signals based on processing a respective one of the set of delayed timing signals through a respective glitch elimination component.

Figure 8:
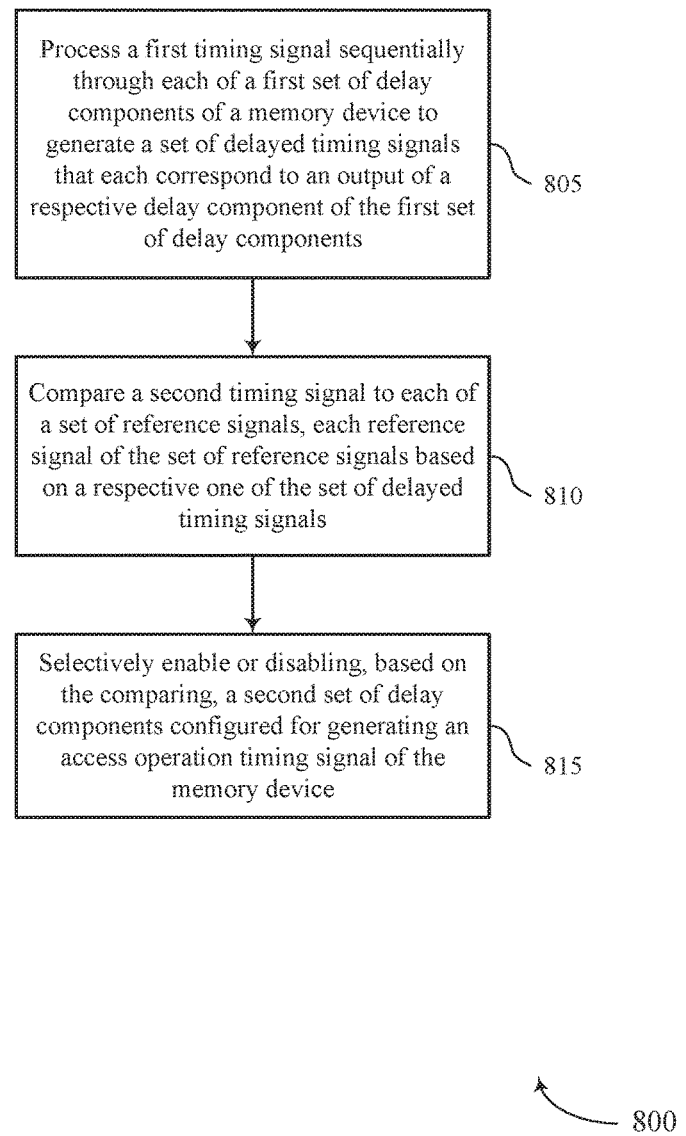
FIG. 8 shows a flowchart illustrating a method or methods that support timing signal calibration for a memory device in accordance with examples as disclosed herein.

FIG. 8 shows a flowchart illustrating a method or methods 800 that supports timing signal calibration for a memory device in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may process a first timing signal sequentially through each of a first set of delay components of a memory device to generate a set of delayed timing signals that each correspond to an output of a respective delay component of the first set of delay components. The operations of 805 may be performed according to the methods described herein. In some examples, aspects of the operations of 805 may be performed by a calibration delay chain component as described with reference to FIG. 7.

At 810, the memory device may compare a second timing signal to each of a set of reference signals, each reference signal of the set of reference signals based on a respective one of the set of delayed timing signals. The operations of 810 may be performed according to the methods described herein. In some examples, aspects of the operations of 810 may be performed by a calibration signal comparison component as described with reference to FIG. 7.

At 815, the memory device may selectively enable or disabling, based on the comparing, a second set of delay components configured for generating an access operation timing signal of the memory device. The operations of 815 may be performed according to the methods described herein. In some examples, aspects of the operations of 815 may be performed by an access operation delay chain component as described with reference to FIG. 7.

In some examples, an apparatus as described herein may perform a method or methods, such as the method 800. The apparatus may include features, circuitry, means, or instructions (e.g., a non-transitory computer-readable medium storing instructions executable by a processor) for processing a first timing signal sequentially through each of a first set of delay components of a memory device to generate a set of delayed timing signals that each correspond to an output of a respective delay component of the first set of delay components, comparing a second timing signal to each of a set of reference signals, each reference signal of the set of reference signals based on a respective one of the set of delayed timing signals, and selectively enabling or disabling, based on the comparing, a second set of delay components configured for generating an access operation timing signal of the memory device.

Some examples of the method 800 and the apparatus described herein may further include operations, features, circuitry, means, or instructions for generating the access operation timing signal for latching data for output by the memory device based on the selectively enabling or disabling of the second set of delay components.

In some examples of the method 800 and the apparatus described herein, generating the access operation timing signal may include operations, features, circuitry, means, or instructions for generating a pulse width for the access operation timing signal based on the selectively enabling or disabling of the second set of delay components.

In some examples of the method 800 and the apparatus described herein, generating the access operation timing signal may include operations, features, circuitry, means, or instructions for generating a timing for the access operation timing signal relative to a column selection of the memory device based on the selectively enabling or disabling of the second set of delay components.

Some examples of the method 800 and the apparatus described herein may further include operations, features, circuitry, means, or instructions for identifying an initial configuration operation after powering the memory device, and generating the first timing signal based on identifying the initial configuration operation.

Some examples of the method 800 and the apparatus described herein may further include operations, features, circuitry, means, or instructions for identifying a change of a frequency set point of the memory device, and generating the first timing signal based on identifying the change of the frequency set point.

Some examples of the method 800 and the apparatus described herein may further include operations, features, circuitry, means, or instructions for generating the second timing signal based on a pulse width of a clock signal received at the memory device.

Some examples of the method 800 and the apparatus described herein may further include operations, features, circuitry, means, or instructions for generating each of the set of reference signals based on processing a respective one of the set of delayed timing signals through a respective glitch elimination component.

In some examples of the method 800 and the apparatus described herein, the second set of delay components may be different than the first set of delay components.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells, a timing calibration component including: a first set of delay components configured to generate a set of delayed timing signals that each correspond to an output of a respective delay component of the first set of delay components, and a comparison component configured to generate a set of delay configuration signals, each delay configuration signal generated based on comparing a second timing signal to a respective one of a set of reference signals, each reference signal of the set of reference signals based on a respective one of the set of delayed timing signals. The apparatus may also include an access timing component coupled with the array of memory cells and the timing calibration component, the access timing component including a second set of delay components configured to generate an access operation timing signal to access the array of memory cells, where each delay component of the second set of delay components may be configured for being selectively enabled or disabled based on the set of delay configuration signals.

In some examples, the access timing component may be configured to generate the access operation timing signal for latching data for output by the apparatus based on the second set of delay components being selectively enabled or disabled.

In some examples, the access timing component may be configured to generate the access operation timing signal with a pulse width that is based on the second set of delay components being selectively enabled or disabled.

In some examples, the access timing component may be configured to generate the access operation timing signal with a timing, relative to a column selection of the array of memory cells, that is based on the second set of delay components being selectively enabled or disabled.

In some examples, the timing calibration component may be configured to generate the set of delay configuration signals based on identifying an initial configuration operation after powering the apparatus.

In some examples, the timing calibration component may be configured to generate the set of delay configuration signals based on identifying a change of frequency set point of the apparatus.

Some examples of the apparatus may include a second signal generator configured for generating the second timing signal based on a pulse width of a clock signal.

In some examples, the timing calibration component may include a set of glitch elimination circuits, and the timing calibration component may be configured for generating each reference signal of the set of reference signals based on a respective one of the set of glitch elimination circuits.

In some examples, each delay component of the first set of delay components includes a respective set of transistor gate delay components.

In some examples, each delay component of the second set of delay components includes a respective second set of transistor gate delay components different than the respective set of transistor gate delay components of the first set of delay components.

Another apparatus is described. The apparatus may include an array of memory cells, a column decoder coupled with the array of memory cells and configured to activate a column of the array of memory cells based on a column selection signal, a read latch coupled with the array of memory cells and configured to latch a result of accessing a memory cell of the activated column based on a read trigger signal, and a signal generator coupled with the column decoder and the read latch, the signal generator configured to generate the read trigger signal with a timing, relative to the column selection signal, that is based on selectively enabling or disabling a set of delay components according to a delay value.

Some examples of the apparatus may include delay calibration circuitry configured to process a first timing signal sequentially through each of a second plurality of delay components to generate a plurality of delayed timing signals, each delayed timing signal of the plurality of delayed timing signals corresponding to an output of a respective delay component of the second plurality of delay components, compare a second timing signal to each of a plurality of reference signals, each reference signal of the plurality of reference signals based at least in part on a respective one of the plurality of delayed timing signals, and generate the delay value associated with the selectively enabling or disabling the plurality of delay components of the signal generator In some examples of the apparatus, the delay calibration circuitry may be configured to generate the second timing signal based on a pulse width of a clock signal received at the apparatus.

In some examples of the apparatus, the delay calibration circuitry may be configured to generate each of the set of reference signals based on processing a respective one of the set of delayed timing signals through a respective glitch elimination component.

In some examples of the apparatus, the delay calibration circuitry may be configured to identify an initial configuration operation after powering the apparatus, and generate, based on identifying the initial configuration operation, a set of delay configuration signals associated with the selectively enabling or disabling the set of delay components of the signal generator.

In some examples of the apparatus, the delay calibration circuitry may be configured to identify a change of a frequency set point of the apparatus, and generate, based on identifying the change of the frequency set point, a set of delay configuration signals associated with the selectively enabling or disabling the set of delay components of the signal generator.

In some examples, the signal generator may be configured to generate the read trigger signal with a pulse width that may be based on the selective enabling or disabling.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    processing a first timing signal sequentially through each of a first plurality of delay components of a memory device to generate a plurality of delayed timing signals that each correspond to an output of a respective delay component of the first plurality of delay components;
    comparing a second timing signal to each of a plurality of reference signals, each reference signal of the plurality of reference signals based at least in part on a respective one of the plurality of delayed timing signals;
    selectively enabling or disabling, based at least in part on the comparing, a second plurality of delay components configured for generating an access operation timing signal of the memory device; and
    generating the access operation timing signal for latching data for output by the memory device based at least in part on the selectively enabling or disabling of the second plurality of delay components, wherein generating the access operation timing signal comprises generating a pulse width for the access operation timing signal based at least in part on the selectively enabling or disabling of the second plurality of delay components.

2. The method of claim 1, wherein generating the access operation timing signal comprises:
    generating a timing for the access operation timing signal relative to a column selection of the memory device based at least in part on the selectively enabling or disabling of the second plurality of delay components.

3. The method of claim 1, further comprising:
    identifying an initial configuration operation after powering the memory device; and
    generating the first timing signal based at least in part on identifying the initial configuration operation.

4. The method of claim 1, further comprising:
    generating the second timing signal based at least in part on a pulse width of a clock signal received at the memory device.

5. The method of claim 1, further comprising:
    generating each of the plurality of reference signals based at least in part on processing a respective one of the plurality of delayed timing signals through a respective glitch elimination component.

6. The method of claim 1, wherein the second plurality of delay components is different than the first plurality of delay components.

7. A method, comprising:
    identifying a change of a frequency set point of a memory device;
    generating a first timing signal based at least in part on identifying the change of the frequency set point;
    processing the first timing signal sequentially through each of a first plurality of delay components of the memory device to generate a plurality of delayed timing signals that each correspond to an output of a respective delay component of the first plurality of delay components;
    comparing a second timing signal to each of a plurality of reference signals, each reference signal of the plurality of reference signals based at least in part on a respective one of the plurality of delayed timing signals; and
    selectively enabling or disabling, based at least in part on the comparing, a second plurality of delay components configured for generating an access operation timing signal of the memory device.

8. The method of claim 7, further comprising:
    generating the access operation timing signal for latching data for output by the memory device based at least in part on the selectively enabling or disabling of the second plurality of delay components.

9. The method of claim 8, wherein generating the access operation timing signal comprises:
    generating a pulse width for the access operation timing signal based at least in part on the selectively enabling or disabling of the second plurality of delay components.

10. The method of claim 7, wherein generating the access operation timing signal comprises:
    generating a timing for the access operation timing signal relative to a column selection of the memory device based at least in part on the selectively enabling or disabling of the second plurality of delay components.

11. The method of claim 7, further comprising:
    identifying an initial configuration operation after powering the memory device; and
    generating the first timing signal based at least in part on identifying the initial configuration operation.

12. An apparatus, comprising:
an array of memory cells;
a timing calibration component comprising:
  a first plurality of delay components configured to generate a plurality of delayed timing signals that each correspond to an output of a respective delay component of the first plurality of delay components;
  a comparison component configured to generate, based at least in part on identifying a change of frequency set point of the apparatus, a plurality of delay configuration signals, each delay configuration signal generated based at least in part on comparing a second timing signal to a respective one of a plurality of reference signals, each reference signal of the plurality of reference signals based at least in part on a respective one of the plurality of delayed timing signals; and
  an access timing component coupled with the array of memory cells and the timing calibration component, the access timing component comprising a second plurality of delay components configured to generate an access operation timing signal to access the array of memory cells, wherein each delay component of the second plurality of delay components is configured for being selectively enabled or disabled based at least in part on the plurality of delay configuration signals.

13. The apparatus of claim 12, wherein the access timing component is configured to generate the access operation timing signal for latching data for output by the apparatus based at least in part on the second plurality of delay components being selectively enabled or disabled.

14. The apparatus of claim 12, wherein the access timing component is configured to generate the access operation timing signal with a pulse width that is based at least in part on the second plurality of delay components being selectively enabled or disabled.

15. The apparatus of claim 12, wherein the access timing component is configured to generate the access operation timing signal with a timing, relative to a column selection of the array of memory cells, that is based at least in part on the second plurality of delay components being selectively enabled or disabled.

16. The apparatus of claim 12, wherein the timing calibration component is configured to generate the plurality of delay configuration signals based at least in part on identifying an initial configuration operation after powering the apparatus.

17. The apparatus of claim 12, further comprising:
a second signal generator configured for generating the second timing signal based at least in part on a pulse width of a clock signal.

18. The apparatus of claim 12, wherein the timing calibration component comprises a plurality of glitch elimination circuits, wherein the timing calibration component is configured for generating each reference signal of the plurality of reference signals based at least in part on a respective one of the plurality of glitch elimination circuits.

19. The apparatus of claim 12, wherein each delay component of the first plurality of delay components comprises a respective plurality of transistor gate delay components.

20. The apparatus of claim 12, wherein each delay component of the second plurality of delay components comprises a respective second plurality of transistor gate delay components different than the respective plurality of transistor gate delay components of the first plurality of delay components.

21. An apparatus, comprising:
an array of memory cells;
a column decoder coupled with the array of memory cells and configured to activate a column of the array of memory cells based at least in part on a column selection signal;
a read latch coupled with the array of memory cells and configured to latch a result of accessing a memory cell of the activated column based at least in part on a read trigger signal; and
a signal generator coupled with the column decoder and the read latch, the signal generator configured to generate the read trigger signal with a timing, relative to the column selection signal, that is based at least in part on selectively enabling or disabling a plurality of delay components according to a delay value, and with a pulse width that is based at least in part on the selective enabling or disabling.

22. The apparatus of claim 21, further comprising:
delay calibration circuitry configured to:
  process a first timing signal sequentially through each of a second plurality of delay components to generate a plurality of delayed timing signals, each delayed timing signal of the plurality of delayed timing signals corresponding to an output of a respective delay component of the second plurality of delay components; and
  compare a second timing signal to each of a plurality of reference signals, each reference signal of the plurality of reference signals based at least in part on a respective one of the plurality of delayed timing signals; and
  generate the delay value associated with the selectively enabling or disabling the plurality of delay components of the signal generator.

23. The apparatus of claim 22, wherein the delay calibration circuitry is configured to:
generate the second timing signal based at least in part on a pulse width of a clock signal received at the apparatus.

24. The apparatus of claim 22, wherein the delay calibration circuitry is configured to:
generate each of the plurality of reference signals based at least in part on processing a respective one of the plurality of delayed timing signals through a respective glitch elimination component.

25. The apparatus of claim 22, wherein the delay calibration circuitry is configured to:
identify an initial configuration operation after powering the apparatus; and
generate, based at least in part on identifying the initial configuration operation, a plurality of delay configuration signals associated with the selectively enabling or disabling the plurality of delay components of the signal generator.

26. The apparatus of claim 22, wherein the delay calibration circuitry is configured to:
identify a change of a frequency set point of the apparatus; and
generate, based at least in part on identifying the change of the frequency set point, a plurality of delay configuration signals associated with the selectively enabling or disabling the plurality of delay components of the signal generator.

* * * * *